(12) United States Patent
Cheng

(10) Patent No.: US 8,997,343 B2
(45) Date of Patent: Apr. 7, 2015

(54) METHOD FOR MANUFACTURING MULTILAYER PRINTED CIRCUIT BOARD

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 995 days.

(21) Appl. No.: 13/108,991

(22) Filed: May 17, 2011

(65) Prior Publication Data

US 2011/0283534 A1 Nov. 24, 2011

(30) Foreign Application Priority Data

May 21, 2010 (CN) .......................... 2010 1 0179136

(51) Int. Cl.
| | |
|---|---|
| *H01K 3/10* | (2006.01) |
| *H05K 3/46* | (2006.01) |
| *H05K 3/06* | (2006.01) |
| *H05K 3/40* | (2006.01) |

(52) U.S. Cl.
CPC ................ *H05K 3/4635* (2013.01); *H05K 3/06* (2013.01); *H05K 3/4069* (2013.01); *H05K 2201/055* (2013.01); *H05K 2203/0228* (2013.01); *H05K 2203/0733* (2013.01)

(58) Field of Classification Search
CPC . H05K 3/4069; H05K 3/4614; H05K 3/4635; H05K 2201/055

USPC ............ 29/830–834, 846, 847, 852; 174/254, 174/260; 257/706, 723, 77; 361/720, 749, 361/783; 438/107, 109, 622
See application file for complete search history.

(56) References Cited

U.S. PATENT DOCUMENTS

| | | | |
|---|---|---|---|
| 6,208,521 B1 * | 3/2001 | Nakatsuka | 361/749 |
| 6,699,730 B2 * | 3/2004 | Kim et al. | 438/109 |
| 7,772,109 B2 * | 8/2010 | Machida | 438/622 |

* cited by examiner

*Primary Examiner* — Donghai D Nguyen
(74) *Attorney, Agent, or Firm* — Novak Druce Connolly Bove + Quigg LLP

(57) ABSTRACT

A method for manufacturing multilayer printed circuit board includes step below. A metal substrate is provide, the metal substrate includes a number of substrate unit. A first insulating layer is formed on one surface of the metal substrate. The first insulating layer has a number of first through holes. An electrically conductive circuit is formed in each substrate unit. A second insulating layer is formed on the other surface of the metal substrate. The second insulating layer has a number of second through holes. A first metal cylinder is formed in a first through hole and a second metal cylinder is formed in a second through hole. The number of substrate units are folded and laminated, the connected and aligned first metal cylinder and the second metal cylinder communicates the electrically conductive circuits.

20 Claims, 10 Drawing Sheets

METHOD FOR MANUFACTURING MULTILAYER PRINTED CIRCUIT BOARD

BACKGROUND

1. Technical Field

The present disclosure generally relates to printed circuit boards (PCBs), and particularly, relates to a method for manufacturing a multilayer printed circuit board.

2. Description of Related Art

To accommodate development of miniaturized electronic products with multiple functions, multilayer printed circuit boards are widely used due to their special characteristics such as lightness and high-density interconnectablity.

Multilayer printed circuit boards are manufactured using a typical sheet-by-sheet process. Firstly, a core substrate is provided and an inner electrically conductive pattern is formed in the core substrate. Secondly, an adhesive layer and a first electrically conductive layer such as copper foil are laminated on the core substrate. Thirdly, an electrically conductive pattern is formed in the first electrically conductive layer. Afterwards, another adhesive and a second electrically conductive layer are laminated on the electrically conductive pattern, and another electrically conductive pattern is formed in the second electrically conductive layer, thus a multilayer printed circuit board is obtained. However, only one electrically conductive layer can be manufactured at a time. During the processes of laminating the first and second electrically conductive layers and forming electrically conductive patterns, conditions such as environmental factors may vary, which can result in different amounts of shrinkage and expansion among the layers making it difficult to align the layers.

What is needed, therefore, is a method for manufacturing a multilayer printed circuit board to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments are now described in detail below and with reference to the drawings.

Referring to FIGS. 1-9, a method for manufacturing a multilayer PCB according to an illustrative embodiment includes the following steps.

Step 1: a metal substrate 110 is provided.

Figure 1:
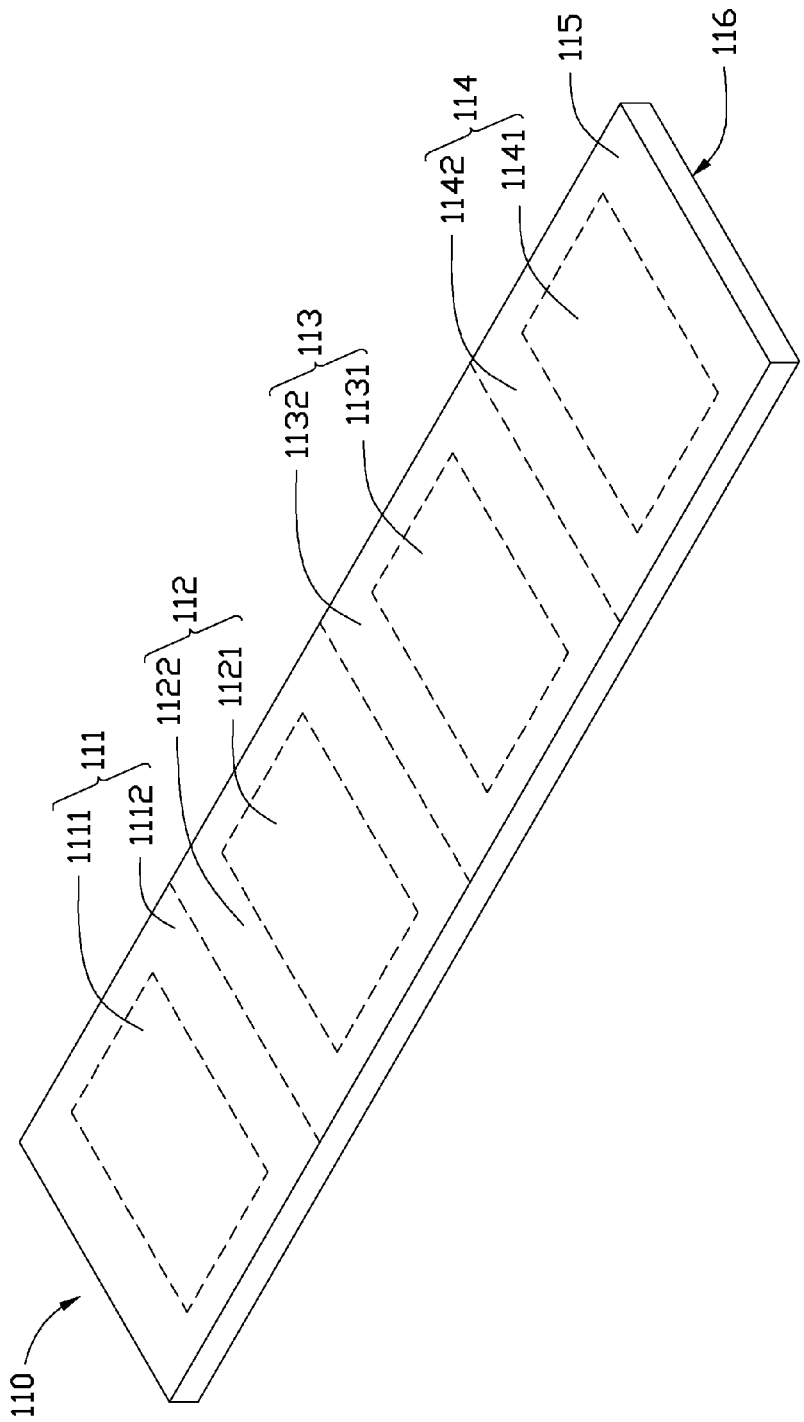
FIG. 1 is a schematic, isometric view of a metal substrate including a number of substrate units in accordance with a first embodiment.

Referring to FIG. 1, in the illustrative embodiment, the metal substrate 110 is long and narrow. The metal substrate 110 has a first substrate unit 111, a second substrate unit 112, a third substrate unit 113, and a fourth substrate unit 114 arranged side by side along a longitudinal direction. The four substrate units 111, 112, 113 and 114 are used for forming four electrically conductive layers of a multilayer printed circuit board. The metal substrate 110 has a first surface 115 and an opposite second surface 116. The metal substrate 110 may be a metal foil, such as a silver foil, an aluminum foil, or a copper foil.

The first substrate unit 111 includes a first layer template 1111 and a first border region 1112 surrounding the first layer template 1111. The first layer template 1111 is in the center of the first substrate unit 111. In the illustrative embodiment, the first layer template 1111 is rectangular. The second substrate unit 112 includes a second layer template 1121 and a second border region 1122 surrounding the second layer template 1121. The third substrate unit 113 includes a third layer template 1131 and a third border region 1132 surrounding the third layer template 1131. The fourth substrate unit 114 includes a fourth layer template 1141 and a fourth border region 1142 surrounding the fourth layer template 1141. The second, third, and fourth layer templates 1121, 1131 and 1141 are identical to the first layer template 1111. The second, third, and fourth border regions 1122, 1132 and 1142 are identical to the first border region 1112.

Figure 2:
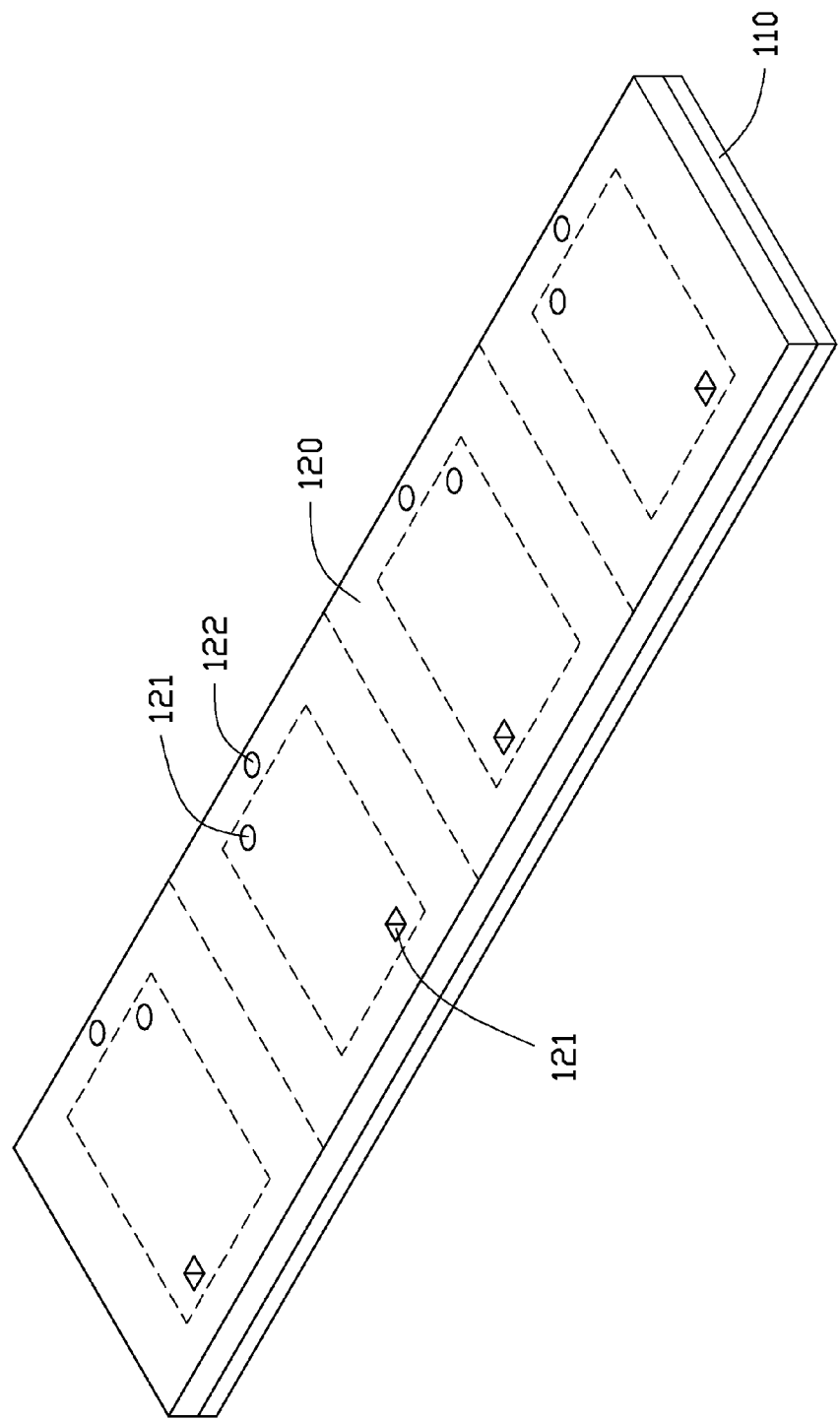
FIG. 2 is similar to FIG. 1, but shows a first insulating layer having a number of first through holes attached on a surface of the metal substrate.

Step 2, referring to FIGS. 1 and 2, a first insulating layer 120 is attached on the first surface 115 of the metal substrate 110. A number of first through holes 121 and a number of alignment holes 122 are defined in the first insulating layer 120, the first through holes 121 proximate to the first surface 115 of the metal substrate 110.

The first insulating layer 120 can be laminated on the first surface 115 of the metal substrate 110. The first through holes 121 and the first alignment holes 122 are defined prior to the first insulating layer 120 being laminated on the first surface 115. The first through holes 121 are arranged directly over the first, second, third and fourth layer templates 1111, 1121, 1131, and 1141. The alignment holes 122 are arranged directly over the first, second, third, and fourth border regions 1112, 1122, 1132 and 1142.

In the illustrative embodiment, there are two first through holes 121 arranged directly over each layer template. A cross section of one of the two through holes 121 is circular, and the other one is rectangular. There is one first alignment hole 122 defined in each border region 1112. The two first through holes 121 over the first layer template 1111 and the two through holes over the second layer template 1121 are symmetrical with respect to an imaginary boundary between the first substrate unit 111 and the second substrate unit 112. The first alignment hole 122 arranged over the first border region 1112 and the first alignment hole 122 arranged over the second border region 1122 are symmetrical with respect to an imaginary boundary between the first substrate unit 111 and the second substrate unit 112. The two first through holes 121 arranged over the second layer template 1121 and the two through holes arranged over the third layer template 1131 are symmetrical with respect to an imaginary boundary between the second substrate unit 112 and the third substrate unit 113. The first alignment hole 122 arranged over the second border region 1122 and the first alignment hole 122 arranged over the third border region 1132 are symmetrical with respect to an imaginary boundary between the second substrate unit 112 and the third substrate unit 113. The two first through holes 121 arranged over the third layer template 1131 and the two first through holes 121 arranged over the fourth layer template 1141 are symmetrical with respect to an imaginary boundary between the third substrate unit 113 and the fourth substrate unit 114. The first alignment hole 122 arranged over the third border region 1132 and the first alignment hole 122 arranged over the fourth border region 1142 are symmetrical with respect to an imaginary boundary between the third substrate unit 113 and the fourth substrate unit 114.

In alternative embodiments, the first insulating layer 120 may be formed by printing liquid insulating ink. A screen configured to form the first through holes 121 and the first alignment holes 122 in the layer 120 is disposed on the first surface 115. The liquid insulating ink is applied to the screen, thus forming the first insulating layer 120 on the first surface 115 of the metal substrate 110. The liquid insulating ink may be liquid polyimide or liquid crystal polymer material.

Figure 3:
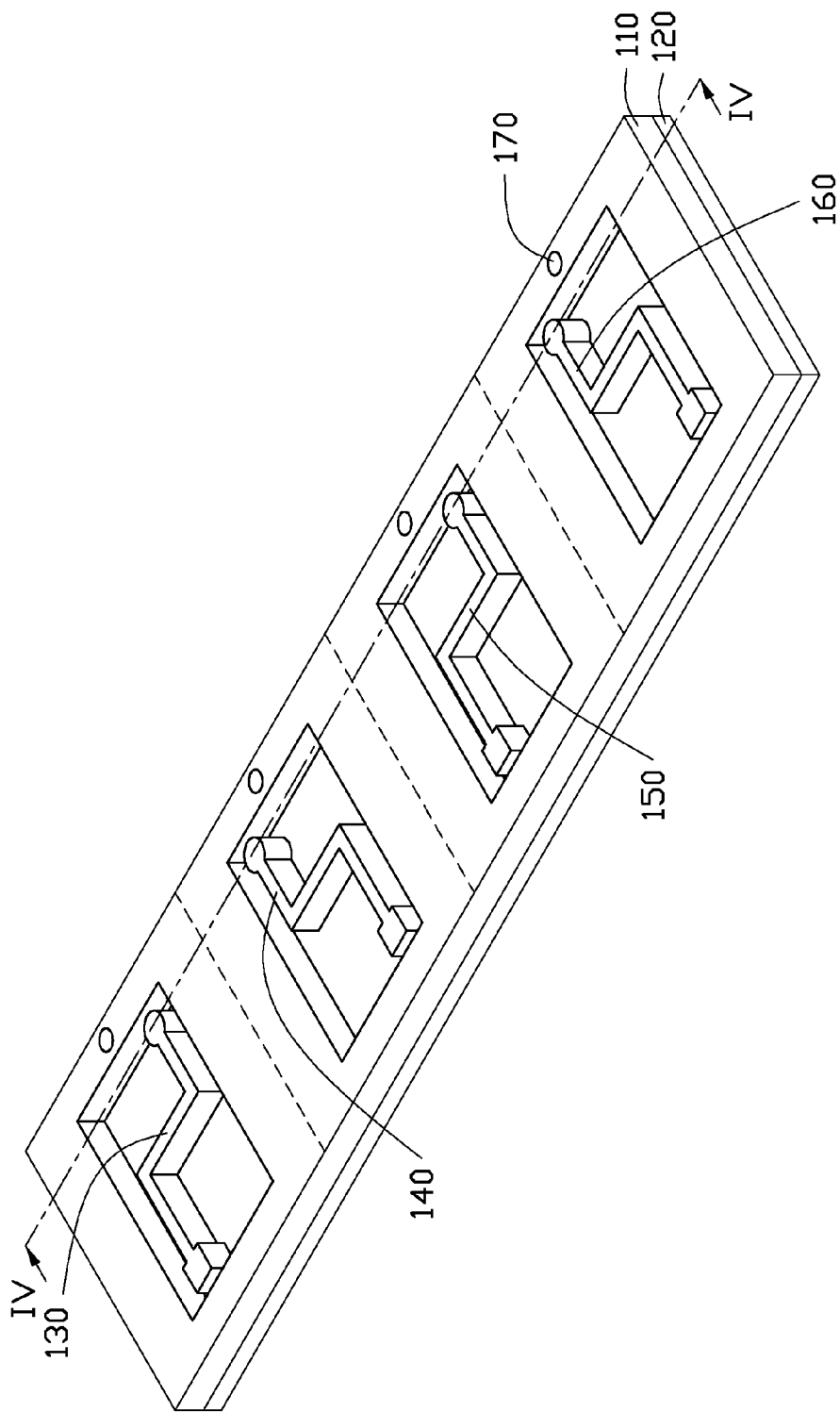
FIG. 3 is similar to FIG. 2, but shows an electrically conductive circuit is formed in each substrate unit.
Figure 4:
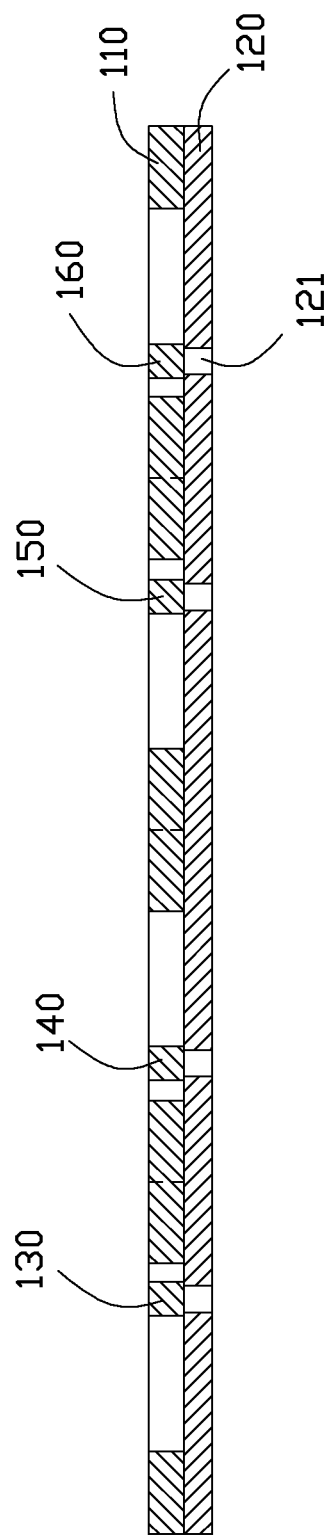
FIG. 4 is cross-sectional view of FIG. 3 taken along line IV-IV.

Step 3, referring to FIGS. 1, 3 and 4, a first electrically conductive circuit 130 is formed by removing a portion of the first electrically conductive layer 111 in the first layer template 1111, a second electrically conductive circuit 140 is formed by removing portion of the first electrically conductive layer 111 in the second layer template 1121, a third electrically conductive circuit 150 is formed by removing portion of the first electrically conductive layer 111 in the third layer template 1131, and a fourth electrically conductive circuit 160 is formed by removing portion of the first electrically conductive layer 111 in the fourth layer template 1141.

The first, second, third, and fourth electrically conductive circuits 130, 140, 150, and 160 may be formed by using a photolithography process and an etching process. An inner diameter of the first through hole 121 is smaller than widths of the first, second, third, and fourth electrically conductive circuits 130, 140, 150, and 160. Portions of the first, second, third, and fourth electrically conductive circuits 130, 140, 150, and 160 are respectively exposed through the first through holes 121.

In the illustrative embodiment, when forming the first, second, thirds and fourth electrically conductive circuits 130, 140, 150, and 160, a number of second alignment holes 170 are formed. The second alignment holes 170 are respectively communicated with the first alignment holes 122.

Figure 5:
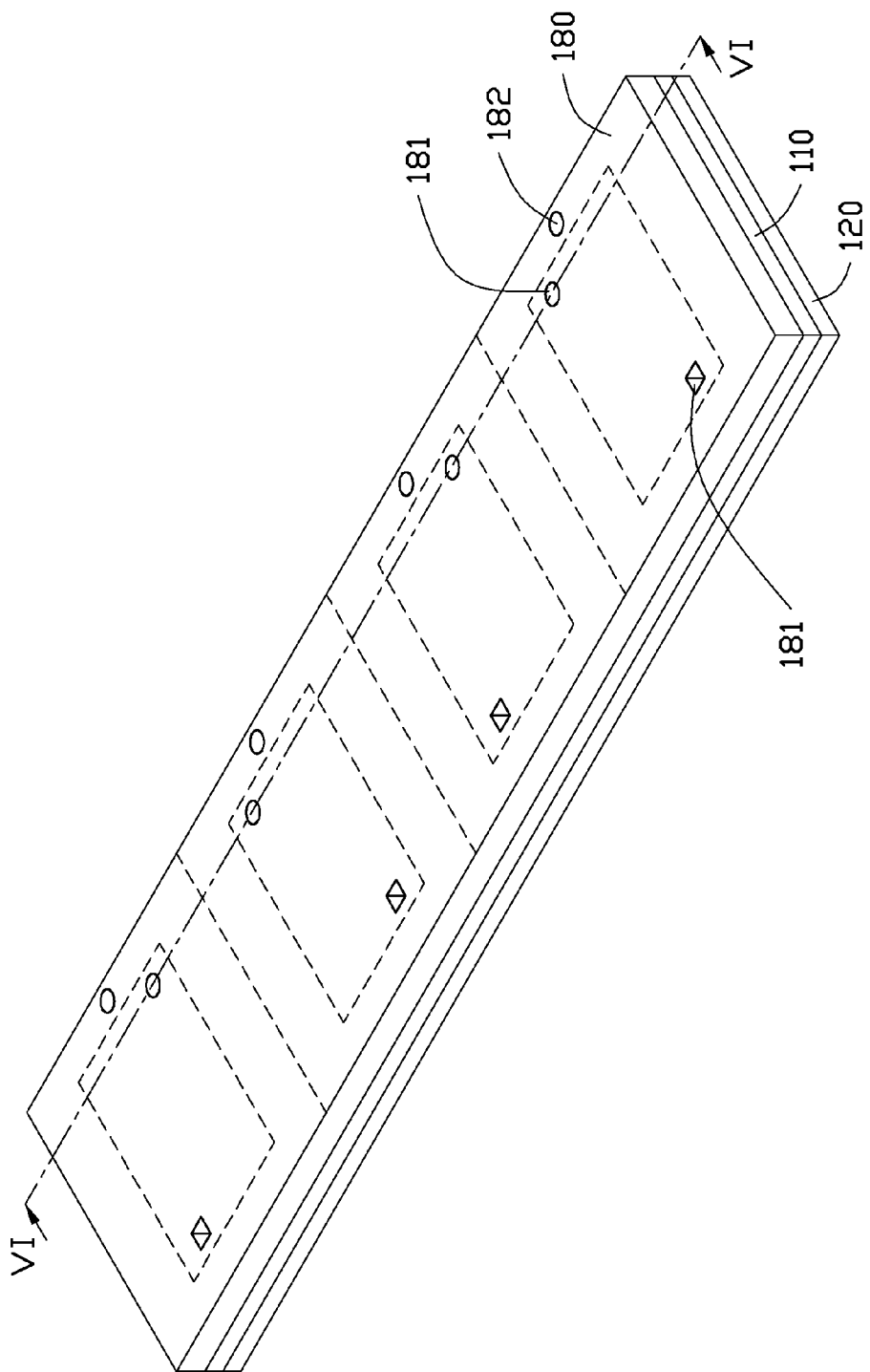
FIG. 5 is similar to FIG. 3, but shows a second insulating layer having a number of second through holes formed on the other surface of the metal substrate.
Figure 6:
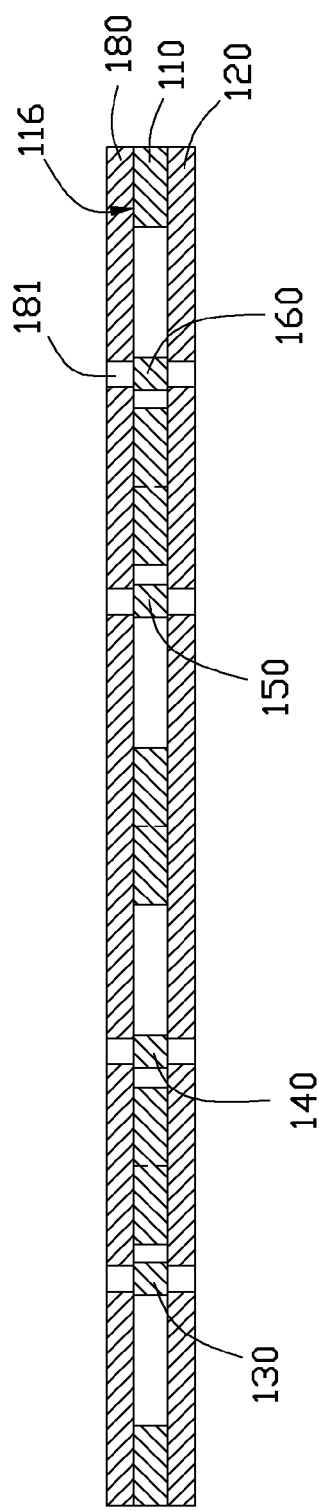
FIG. 6 is cross-sectional view of FIG. 5 taken along line VI-VI.

Step 4, referring to FIGS. 5 and 6, a second insulating layer 180 is formed on the second surface 116 of the metal substrate 110. A number of second through holes 181 and a number of third alignment holes 182 are defined in second insulating layer 180.

The second through holes 181 and the third alignment holes 182 are formed prior to the second insulating layer 180 being laminated on the second surface 116. The second insulating layer 180 can be formed using the same method used to form the first insulating layer 120. Each second through hole 181 is aligned with the corresponding first through hole 121. Each third alignment hole 182 is communicated with the corresponding first alignment hole 122 and the corresponding second alignment hole 170. Portions of the first, second, third, and fourth electrically conductive circuit 130, 140, 150 and 160 are respectively exposed through the corresponding second through holes 181.

Figure 7:
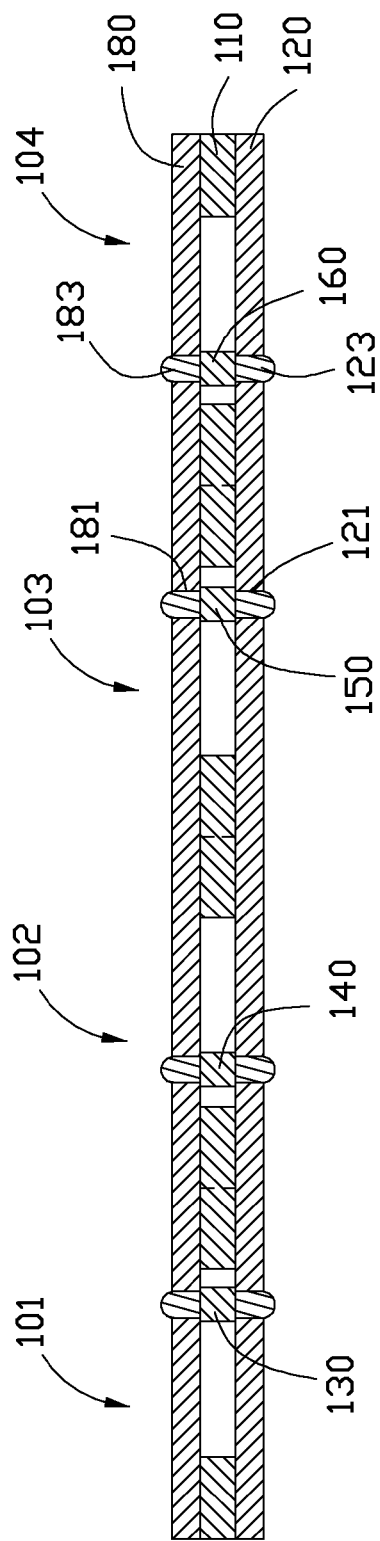
FIG. 7 is similar to FIG. 5, but shows a first metal cylinder formed in each first through hole and a second metal cylinder formed in each second through hole.

Step 5, referring to FIG. 7, a first metal cylinder 123 is formed in each first through hole 121, the first metal cylinder 123 protrudes from the first insulating layer 120. A second metal cylinder 183 is formed in each second through hole 181, the second metal cylinder 183 protrudes from the second insulating layer 180.

The first metal cylinders 123 and the second cylinder 183 can be formed by printing solder paste through a steel plate with holes. The steel plate with holes is placed on the first insulating layer 120 or the second insulating layer 180 with the holes of the steel plate respectively in communication with the first through holes 121 or the second through holes 181. A thickness of the first insulating layer 120 or the second insulating layer 180 is about 30 micrometers. A thickness of the steel plate is about 10 micrometers. A height of the first metal cylinder is greater than the thickness of the first insulating layer 120. A height of the second metal cylinder is greater than the thickness of the second insulating layer 180. One end portion of the first metal cylinder 123 is electrically connected to one of the first, second, third, and fourth electrically conductive circuits 130, 140, 150 and 160, and the other end portion of the first metal cylinder 123 protrudes from a surface of the first insulating layer 120. One end portion of the second metal cylinder 183 is electrically connected to one of the first, second, third, and fourth electrically conductive circuits 130, 140, 150 and 160, and the other end portion of the second metal cylinder 183 protrudes from a surface of the second insulating layer 180.

After the first metal cylinder 123 and the second metal cylinder 183 are formed by printing, the first metal cylinder 123 and the second metal cylinder 183 are treated by a high temperature reflow and setting process. Thus, the first metal cylinder 123 fully fills the first through holes 122, and the second metal cylinder 183 fully fills the second through holes 183.

The first electrically conductive circuit 130 in the first substrate unit 111, the first insulating layer 120 formed on the first substrate unit 111, the second insulating layer 180 formed on the first substrate unit 111, and the first metal cylinder 123 and the second metal cylinder 183 formed on the first electrically conductive circuit 130 cooperatively form a first circuit board unit 101. The second electrically conductive circuit 140 in the second substrate unit 112, the first insulating layer 120 formed on the second substrate unit 112, the second insulating layer 180 formed on the second substrate unit 112, and the first metal cylinder 123 and the second metal cylinder 183 formed on the second electrically conductive circuit 140 cooperatively form a second circuit board unit 101. The third electrically conductive circuit 150 in the third substrate unit 113, the first insulating layer 120 formed on the third substrate unit 113, the second insulating layer 180 formed on the third substrate unit 113, and the first metal cylinder 123 and the second metal cylinder 183 formed on the third electrically conductive circuit 150 cooperatively form a third circuit board unit 103. The fourth electrically conductive circuit 160 in the fourth substrate unit 114, the second insulating layer 180 formed on the fourth substrate unit 114, and the first metal cylinder 123 and the second metal cylinder 183 formed on the fourth electrically conductive circuit 160 cooperatively form a fourth circuit board unit 104.

Figure 8:
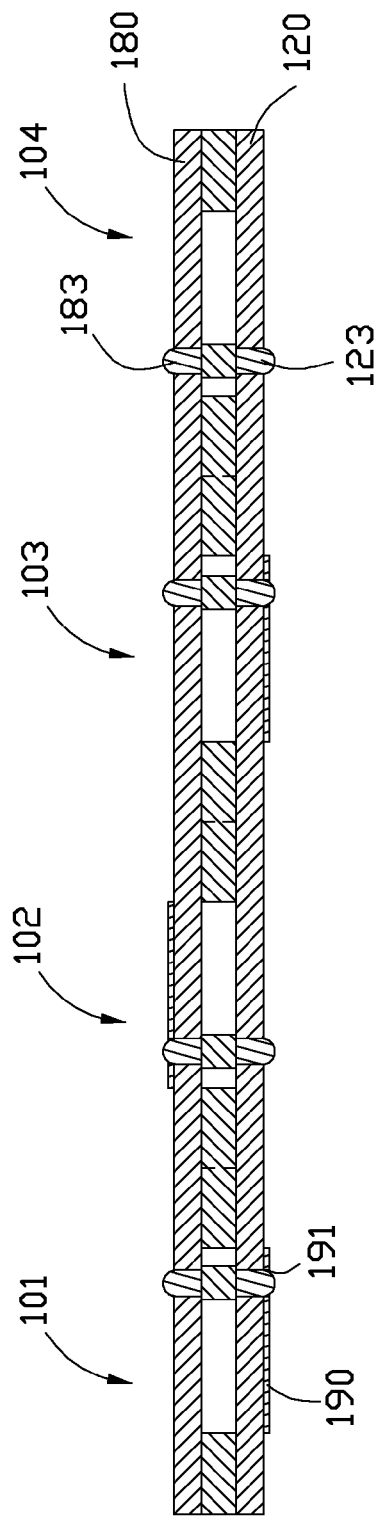
FIG. 8 is similar to FIG. 7, but shows an adhesive sheet formed on the surface of the first insulating layer or the surface of the second insulating layer.

Step 6, referring to FIG. 8, a number of adhesive sheets 190 are formed on selected areas of the first insulating layer 120 and the surface of the second insulating layer 180 of the first, second, third, and fourth circuit board units 101, 102, 103 or 104 such that the adhesive sheets 190 are sandwiched between insulating layers 120, 180 when the combination of layers and substrate are folded to form the multilayer circuit board 10. A number of third through holes 191 are defined in each adhesive sheet 190. The first metal cylinder 123 and the second metal cylinder 183 are exposed through the adhesive layer 190.

The third through holes 190 are formed in each adhesive sheet 190 prior to the adhesive sheet 190 being laminated on each circuit board units. The adhesive sheet 190 may be a pre-preg.

In the illustrative embodiment, the first, second, third, and fourth circuit board units 101, 102, 103, and 104 are stacked in the above order. By folding the first, second, third, and fourth circuit board units 101, 102, 103 and 104, the second insulating layer 180 of the first circuit board unit 101 faces the second insulating layer 180 of the second circuit board unit 102, the first insulating layer 120 of the second circuit board unit 102 faces the first insulating layer 120 of the third circuit board unit 103, the second insulating layer 180 of the third circuit board unit 103 faces the second insulating layer 180 of the fourth circuit board unit 104. The adhesive sheets 190 are respectively formed on the surface of the second insulating layer 180 of the first circuit board unit 101, the surface of first insulating layer 120 of the second circuit board unit 102, and the surface of the second insulating layer 180 of the third circuit board unit 103. The size and shape of the adhesive sheets 190 are same as those of the first layer template 1111.

It can be understood, the adhesive sheets 190 also can be formed by other methods. After folding the first, second, third, and fourth circuit board units 101, 102, 103, and 104, one adhesive sheet 190 is applied between the neighboring circuit board units.

Figure 9:
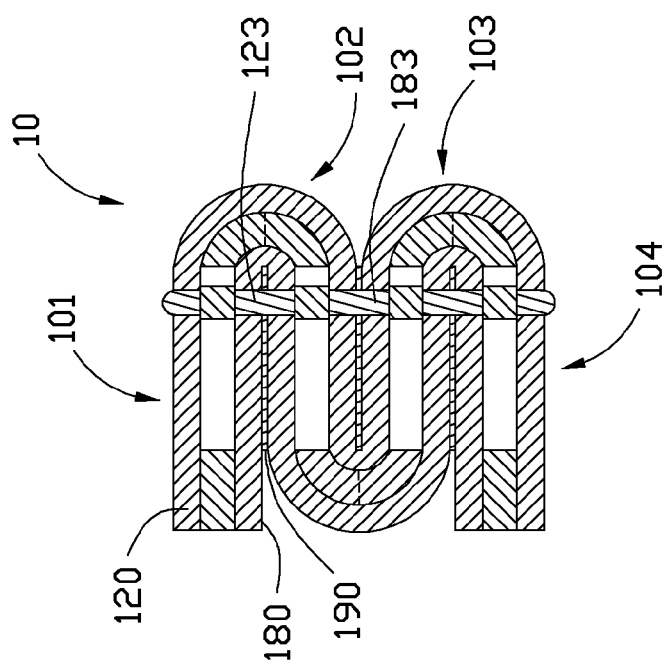
FIG. 9 is similar to FIG. 8, but shows a number of circuit board units folded and laminated to form a multilayer printed circuit board.

Step 7, referring to FIG. 9, the first, second, third, and fourth circuit board units 101, 102, 103 and 104 are folded and laminated. The first electrically conductive circuit 130, the second electrically conductive circuit 140, the first metal cylinder 123 and the second metal cylinder 183 in the neighboring circuit board units are aligned and connected, thus the third electrically conductive circuit 150, and the fourth electrically conductive circuit 160 are electrically connected by the first metal cylinder 123 or the second metal cylinder 183 between each two neighboring laminated electrically conductive circuits, thus a multilayer printed circuit board 10 is obtained.

In the folding process, the first circuit board unit 101, the second circuit board unit 102, the third circuit board unit 103, and the fourth circuit board unit 104 are aligned using the first, second, and third alignment holes 122, 170 and 182. The first, second and third alignment holes 122, 170 and 182 in the circuit board units are communicated with each other, thus the first metal cylinder 123 and the second metal cylinder 183 are superposed.

When the first circuit board unit 101, the second circuit board unit 102, the third circuit board unit 103, and the fourth circuit board unit 104 are laminated, the first circuit board unit 101, the second circuit board unit 102, the third circuit board unit 103, and the fourth circuit board unit 104 are heated. The first metal cylinder 123 and the second metal cylinder 183 are melted, thus the first metal cylinder 123 and second metal cylinder 182 form a single body.

Figure 10:
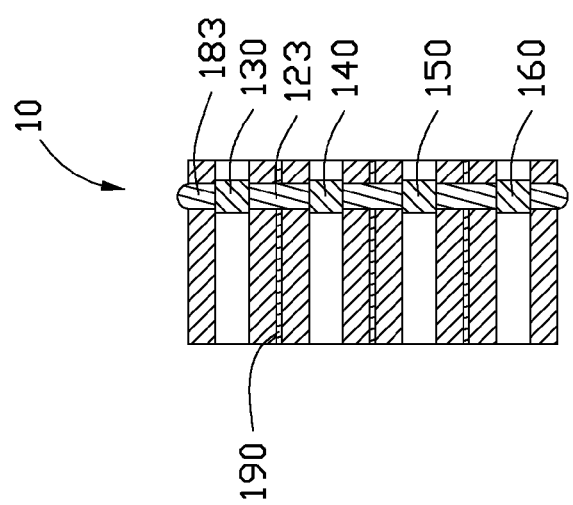
FIG. 10 is similar to FIG. 9, but shows the multilayer printed circuit board cut to size.

Step 8, referring to FIG. 10, the multilayer printed circuit board 10 is cut along a boundary of the first layer template 1111. After the multilayer printed circuit board 10 is cut, the size of the multilayer printed circuit board 10 of desired dimensions is achieved.

In the present embodiment, the circuit board units are formed simultaneously, and the problem of different amounts of shrinkage and expansion of the different layers can be overcome. Thus, the circuit board units can be easily aligned.

It is believed that the present embodiments and their advantages will be understood from the foregoing description, and it will be apparent that various changes may be made thereto without departing from the spirit and scope of the disclosure or sacrificing all of its material advantages, the examples herein before described merely being preferred or exemplary embodiments of the disclosure.

The invention claimed is:

1. A method for manufacturing multilayer printed circuit board, comprising:
    providing a metal substrate having a first surface and an opposite second surface, the metal substrate comprising a plurality of substrate units, each substrate unit comprising a layer template and a border region surrounding the layer template;
    attaching a first insulating layer to the metal substrate, the first insulating layer having a plurality of first through holes proximate to the first surface of the metal substrate, each first through hole being arranged directly above a corresponding layer template;
    forming electrically conductive circuits by removing a portion of each layer template, a part of each electrically conductive circuit being exposed through the corresponding first through hole;
    forming a second insulating layer on the second surface of the metal substrate, the second insulating layer having a plurality of second through holes, the second insulating layer having the plurality of second through holes aligned with the respective first through holes, each electrically conductive circuit being exposed through the corresponding second through hole;
    forming a first metal cylinder in each first through hole, the first metal cylinder protruding from the first insulating layer;
    forming a second metal cylinder in each second through hole, the second metal cylinder protruding from the second insulating layer, the corresponding first and the second insulating layers of the electrically conductive circuits and the first and the second metal cylinders cooperatively forming circuit board units; and
    folding and laminating the circuit board units in a manner that the circuit board units are stacked one on another, the electrically conductive circuits of each two neighboring laminated circuit board units being electrically connected by means of aligning and contacting the first metal cylinders thereof or the second metal cylinders thereof.

2. The method of claim 1, wherein the first insulating layer further has a plurality of first alignment holes, each first alignment hole is defined in a respectively border region, a plurality of second alignment holes are defined in the respective border regions of the substrate units, the second insulating layer further has a plurality of third alignment holes, each third alignment hole is defined in a respectively border region, each first alignment hole communicates with the respectively second and third hole, the first, second and third alignment holes of the circuit board units are aligned with each other when the circuit board units are folded and laminated.

3. The method of claim 2, wherein the first metal cylinders are formed by printing solder paste in the first through holes, the second metal cylinders are formed by printing solder paste in the second through holes.

4. The method of claim 3, wherein after printing solder paste in the second through hole, the solder paste in the second through holes are treated by a high temperature reflow and setting process.

5. The method of claim 2, wherein prior to folding the plurality of circuit board units, an adhesive sheet is formed on one of the first insulating layer and the second insulating layer.

6. The method of claim 5, wherein each adhesive sheet has at least one second through hole, the first metal cylinders and the second metal cylinders extending through the corresponding third alignment holes.

7. The method of claim 2, wherein the first metal cylinders or the second metal cylinders, which are aligned and contact each other in each two neighboring laminated circuit board units, are heated and melt to form a single body.

8. The method of claim 2, further comprising cutting off the border region of each of the circuit board units after folding and laminating the circuit board units.

9. The method of claim 2, wherein the plurality of substrate units are arranged along a longitudinal direction of the metal substrate.

10. The method of claim 9, wherein the plurality of substrate units have a same shape and size.

11. The method of claim 1, wherein the first through holes and the second through holes in two neighbor circuit board units are symmetrical with respect to an imaginary boundary between the two neighboring circuit board units.

12. The method of claim 11, wherein the first metal cylinders are formed by printing solder paste in the first through holes, the second metal cylinders are formed by printing solder paste in the second through holes.

13. The method of claim 12, wherein after printing solder paste in the second through hole, the solder paste in the second through holes are treated by a high temperature reflow and setting process.

14. The method of claim 11, wherein prior to folding the plurality of circuit board units, an adhesive sheet is formed on one of the first insulating layer and the second insulating layer.

15. The method of claim 14, wherein each adhesive sheet has at least one second through hole, the first metal cylinders and the second metal cylinders extending through the corresponding third alignment holes.

16. The method of claim 11, wherein the first metal cylinders or the second metal cylinders, which are aligned and contact each other in each two neighboring laminated circuit board units, are heated and melt to form a single body.

17. The method of claim 11, further comprising cutting off the border region of each of the circuit board units after folding and laminating the circuit board units.

18. A method for manufacturing multilayer printed circuit board, comprising:
providing an elongated metal substrate having a first surface and an opposite second surface, the metal substrate comprising a plurality of substrate units arranged along a longitudinal direction thereof, each substrate unit comprising a layer template and a border region surrounding the layer template;
attaching a first insulating layer to the metal substrate, the first insulating layer having a plurality of first through holes proximate to the first surface of the metal substrate, each first through hole being arranged directly above a corresponding layer template;
forming electrically conductive circuits by removing a portion of each layer template, a part of each electrically conductive circuit being exposed through the corresponding first through hole;
forming a second insulating layer on the second surface of the metal substrate, the second insulating layer having a plurality of second through holes, the second through holes being aligned with the respective first through holes, each electrically conductive circuit being exposed through the corresponding second through hole;
forming a first metal cylinder in each first through hole, the first metal cylinder protruding from the first insulating layer;
forming a second metal cylinder in each second through hole, the second metal cylinder protruding from the second insulating layer, the corresponding first and the second insulating layers of the electrically conductive circuits and the first and the second metal cylinders cooperatively forming circuit board units; and
folding and laminating the circuit board units in a manner that the circuit board units are stacked one on another, the electrically conductive circuits of each two neighboring laminated circuit board units being electrically connected by means of aligning and contacting the first metal cylinders thereof or the second metal cylinders thereof.

19. The method of claim 18, wherein the first through hole and the second through holes in two neighboring circuit board units are symmetrical with respect to an imaginary boundary between the two neighboring circuit board units.

20. The method of claim 19, wherein the plurality of substrate units have a same shape and size.

* * * * *